United States Patent [19]

Vaughan, Jr.

[11] Patent Number: 4,812,761
[45] Date of Patent: Mar. 14, 1989

[54] ELECTRICALLY PARALLEL EQUAL PHASE RESONANT LOOPS FOR NUCLEAR MAGNETIC RESONANCE SURFACE COILS

[75] Inventor: J. Thomas Vaughan, Jr., Dallas, Tex.

[73] Assignee: Board of Regents, The University of Texas System, Austin, Tex.

[21] Appl. No.: 100,583

[22] Filed: Sep. 24, 1987

[51] Int. Cl.$^4$ .......................................... G01R 33/20
[52] U.S. Cl. ..................................... 324/307; 324/318
[58] Field of Search ............... 324/300, 307, 309, 312, 324/318, 319, 320, 322; 333/24 C, 24 R; 128/653

[56] References Cited

U.S. PATENT DOCUMENTS

| | | | |
|---|---|---|---|
| 4,536,712 | 8/1985 | Iwaoka et al. | 324/309 |
| 4,545,384 | 10/1985 | Kawachi | 128/653 |
| 4,551,680 | 11/1985 | Macovski | 324/309 |
| 4,583,044 | 4/1986 | Case et al. | 324/309 |
| 4,585,992 | 4/1986 | Maudsley et al. | 324/309 |
| 4,590,427 | 5/1986 | Fukushima | 324/311 |
| 4,599,565 | 7/1986 | Hoenninger, III | 324/309 |
| 4,620,155 | 10/1986 | Edelstein | 324/318 |
| 4,621,237 | 11/1986 | Timms | 324/318 |
| 4,634,979 | 1/1987 | Riederer et al. | 324/307 |
| 4,672,972 | 6/1987 | Berke | 324/322 |
| 4,714,887 | 12/1987 | Meissner | 324/322 |
| 4,724,389 | 2/1988 | Hyde | 324/318 |

OTHER PUBLICATIONS

Hyde et al., "Planar-Pair Local Coils for High-Resolution Magnetic Resonance Imaging, Particularly of the Temporomandibular Joint", Medical Physics, vol. 13, No. 1, pp. 1–7 (Jan./Feb. 1986).
Roeder et al., "NMR Coils with Segments in Parallel to Achieve Higher Frequencies or Larger Sample Volumes", *Journal of Magnetic Resonance*, 59, pp. 307–317 (1984).
Sobol, "Dedicated Coils in Magnetic Resonance Imaging", *Reviews of Magnetic Resonance in Medicine*, vol. 1, No. 2, pp. 181–224 (1986).
Lufkin et al., "Surface Coils in Magnetic Resonance Imaging", *Applied Radiology*, pp. 66–72 (1987).
Kneeland et al., "High-Resolution MR Imaging Using Loop-Gap Resonators", Medical Physics, vol. 158, No. 1, pp. 247–250 (Jan. 1986).
Grist et al., "1.5 T in Vivo 31P NMR Spectroscopy of the Human Liver Using a Sectorial Resonator", *Magnetic Resonance in Medicine* 3, pp. 135–139 (1986).
Stakelon et al., "Sensitivity Considerations for NMR in Metal Single Crystals", Rev. Sci. Instrum., 49(1), pp. 45–49 (Jan. 1978).
Redpath et al., "Design of a Radiofrequency Coil Suitable for NMR Imaging of Heads", Phys. Med. Biol., vol. 27, No. 3, pp. 443–447 (1982).
Jesmanowicz et al., "The Sectorial Loop-Gap Resonator with 31P NMR of the Adult Human Liver at 1.5 T with Surface Tissue Suppression", Magnetic Resonance in Medicine 3, pp. 76–89 (1986).
"MRI Magnetic Resonance Imaging", National Geographic (Jan. 1987).

*Primary Examiner*—Michael J. Tokar
*Attorney, Agent, or Firm*—Arnold, White & Durkee

[57] ABSTRACT

A nuclear magnetic resonance measurement system is disclosed which includes, in combination, means for generating an applied main magnetic field, and an array of at least two radio frequency current loops. The loops are electrically connected in parallel, and are oriented in a generally planar relationship with respect to each other. The loops are connected in phase with respect to each other so that the component of magnetization generated by the loops which orthogonal to the direction of the applied main magnetic field is in the same general direction. A capacitor is preferably electrically connected in parallel with the loops.

15 Claims, 7 Drawing Sheets

"BOW TIE" SYMMETRY OF TWO COILS IN PARALLEL

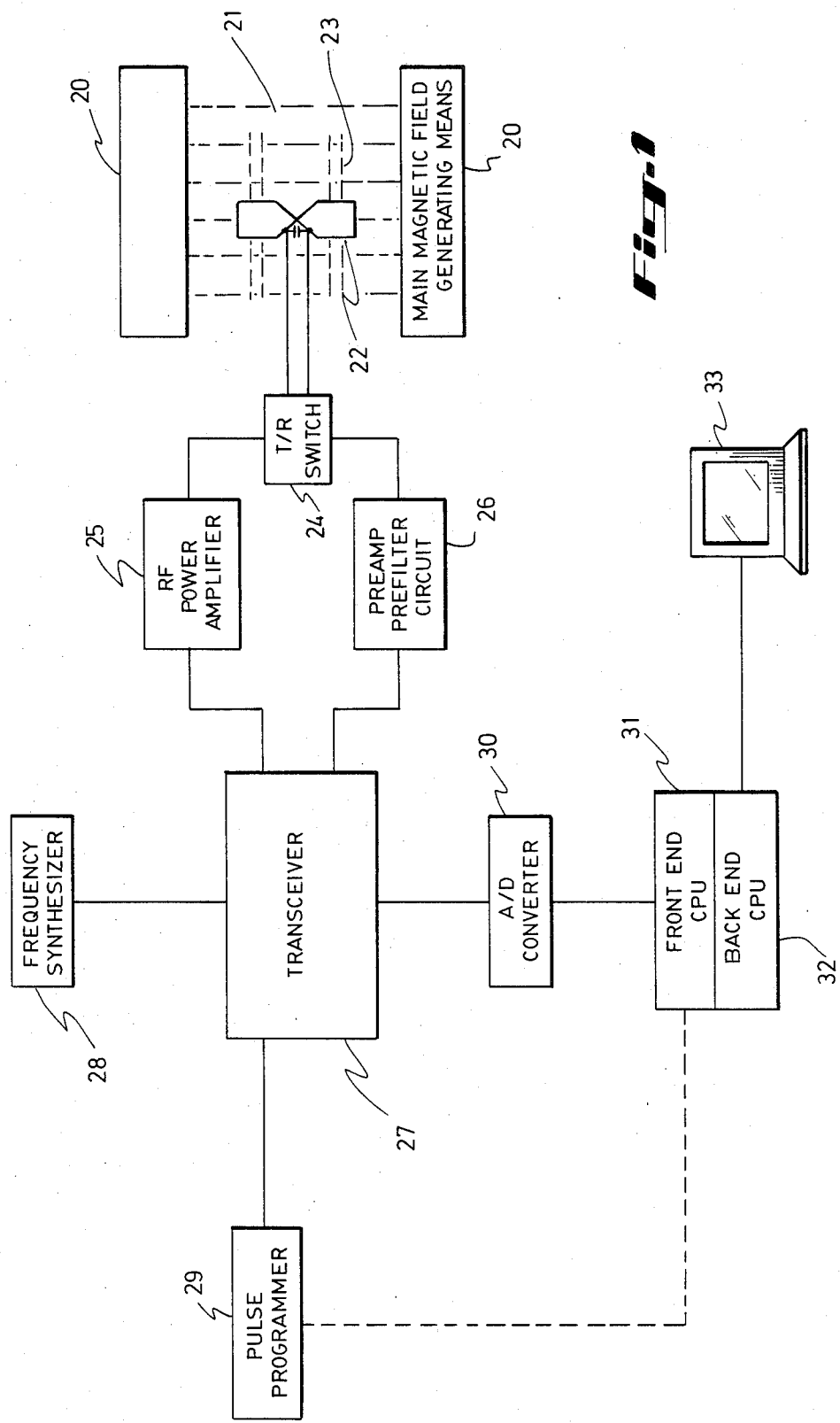

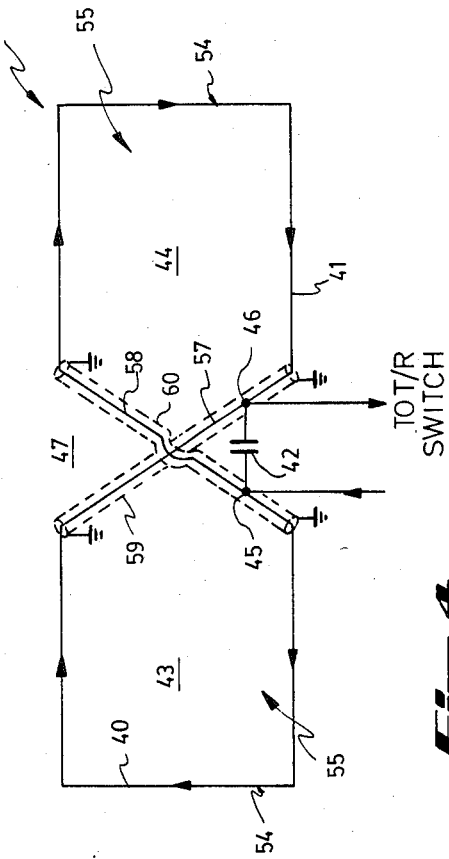
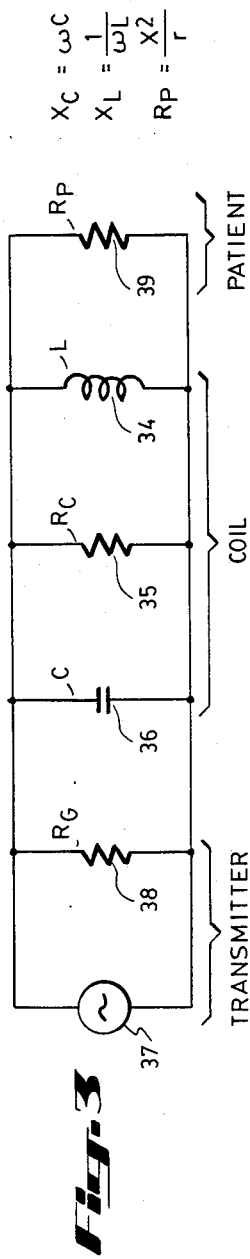
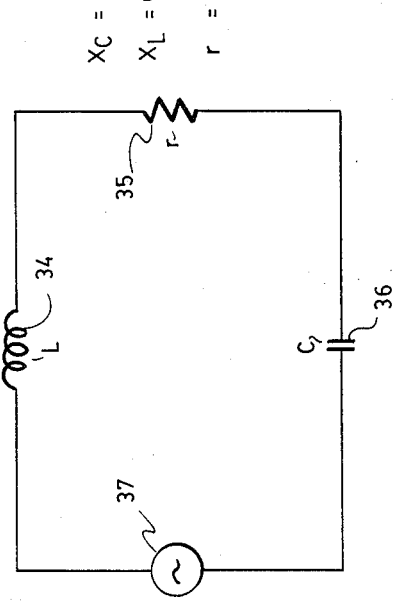

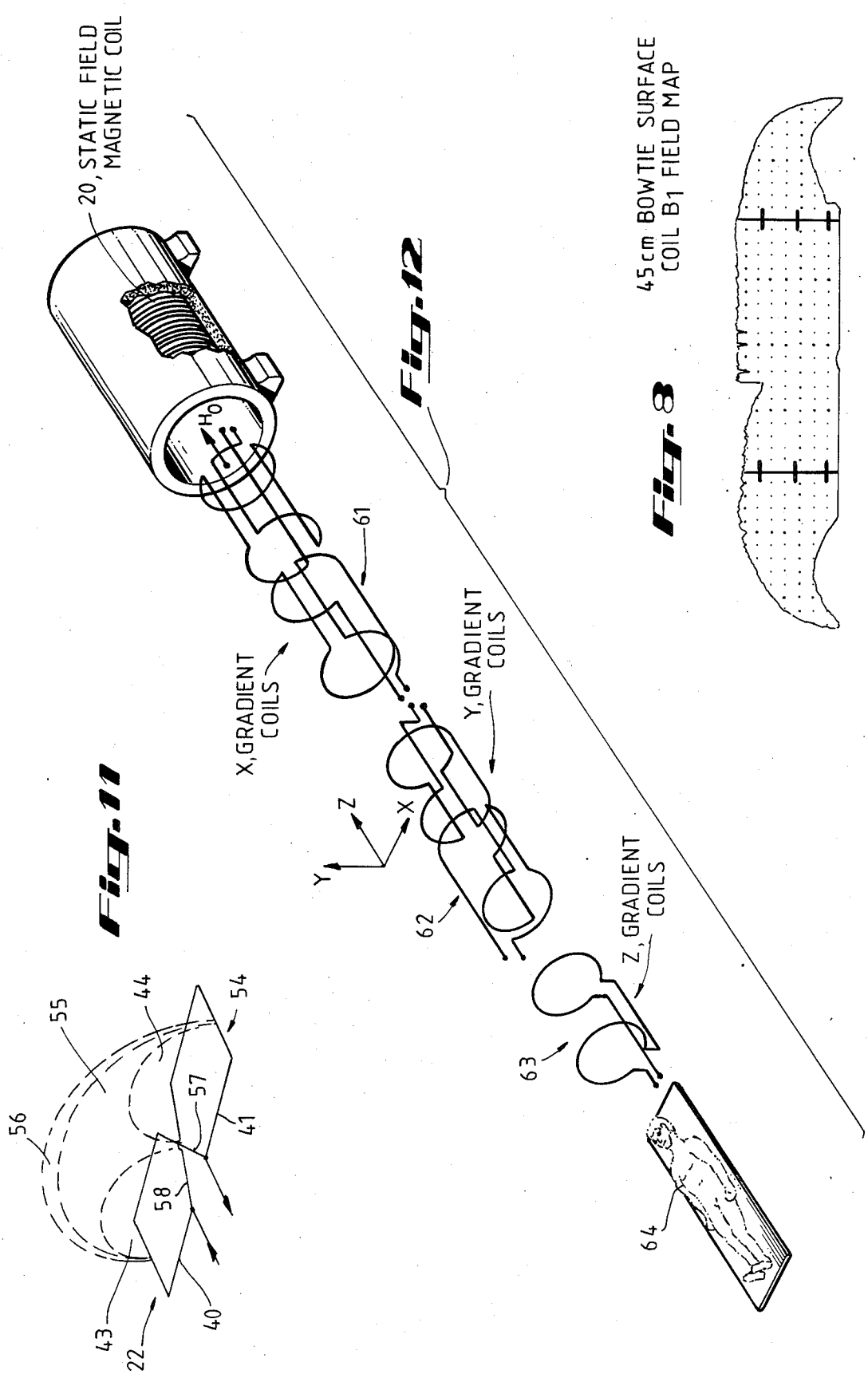

Fig. 9B
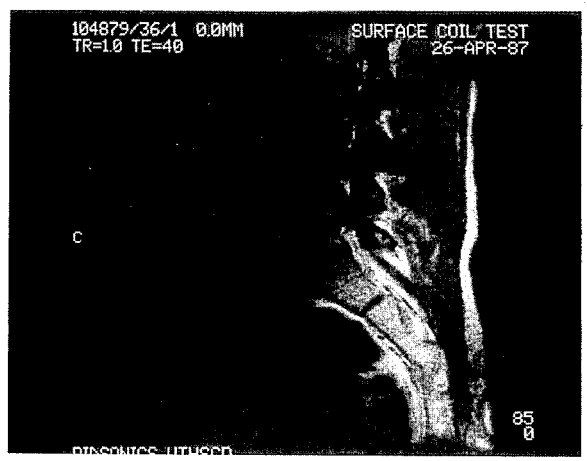
Fig. 9A

ELECTRICALLY PARALLEL EQUAL PHASE RESONANT LOOPS FOR NUCLEAR MAGNETIC RESONANCE SURFACE COILS

BACKGROUND OF THE INVENTION

Nuclear magnetic resonance is sometimes used to obtain information about the chemical composition of matter, e.g., as a radio frequency spectrometer.

Nuclear magnetic resonance is also used as a technique for obtaining images of patients' body tissues. In this context, it is sometimes referred to as magnetic resonance imaging. In either case, it may be used as a noninvasive measurement technique for medical purposes in the treatment of patients.

Magnetic resonance imaging relies on the principle that hydrogen atoms, when subjected to a magnetic field, line up like so many soldiers. If a radio frequency signal is aimed at these atoms, it changes the alignment of their nuclei. When the radio waves are turned off, the nuclei realign themselves, transmitting a small electric signal. And since the body is primarily composed of hydrogen atoms, an image can be generated from the returning pulses, showing tissue and bone marrow.

Nuclear magnetic resonance ("NMR") imaging offers advantages over x-ray imaging. The magnetic fields used in NMR imaging are not harmful like x-rays. Moreover, x-ray imaging only has one degree of freedom. X-ray imaging relies upon the electron density, or relative absorption of x-rays between various tissue groups. It is sometimes impossible to detect, for example, brain tumors using x-ray imaging because the diseased tissue has virtually the same x-ray absorption as the surrounding normal tissue.

In contrast to x-rays, NMR imaging may be said to have three degrees of freedom: proton density and the relaxation times $T_1$ and $T_2$.

These additional degrees of freedom permitted by NMR imaging may be advantageously used to obtain information and to distinguish between tissues, which would not be possible with other techniques.

In some cases, a brain tumor may not be visible in an x-ray image. But NMR imaging may be able to distinguish between such tumor tissue and normal brain tissue, even where x-ray imaging would fail to detect any difference between the two tissue groups. In addition, NMR imaging can be used to look at heart tissue and to detect damaged tissue due to the buildup of lactic acid levels, where x-ray imaging might not be able to detect such tissue.

Much of the hydrogen present in body tissue is found in the form of water molecules. Each molecule of water contains two hydrogen atoms. Bones contain little water, and therefore do not appear in NMR images. As a result, NMR imaging enables doctors to see tissue that is surrounded by bone. NMR imaging is an especially effective tool for imaging the spinal cord. Previously, doctors who wanted to look at the spinal cord using x-ray imaging had to inject it with an x-ray contrast agent, typically using a painful and risky procedure.

In NMR measurement, it is desirable to increase the signal-to-noise ratio of the system. This has been an impetus in the development of higher field and higher frequency apparatus. The signal-to-noise ratio may be increased by increasing the frequency under certain conditions.

For purposes of providing a context for the present invention, it is helpful to start with a general description of NMR measurement techniques. In an NMR application, an essentially static magnetic field is applied to a patient's tissue. A sample coil is placed in close proximity to the patient's tissue which is desired to be imaged. A pulse of radio frequency electric current is then applied to the sample coil at a particular frequency, in order to effect a maximum NMR decay signal.

An NMR scanner surrounds the body with powerful electromagnets. Typically supercooled by liquid helium, these electromagnets create a strong magnetic field.

This field has a profound effect on protons, the nuclei of hydrogen atoms. Spinning like tops, the protons normally point in random directions. But inside the NMR scanner's magnetic field, they generally align themselves in the direction of the magnetic field's poles. Even in alignment, however, they wobble, or precess, at a specific rate, or frequency. The stronger the magnetic field, the greater the frequency (f+).

When the scanner excites these protons with a radio pulse timed to the same frequency as their wobbling, it knocks them out of alignment. Within milliseconds they spiral back into place, "singing out" with a faint radio signal of their own.

A computer translates these faint signals into an image of the area scanned. The image reveals varying densities of hydrogen atoms and their interaction with surrounding tissues in a cross section of the body. Since hydrogen reflects water content, doctors can use the image to make distinctions between tissues. Hydrogen is commonly selected as the basis for NMR image scanning because of its prominent magnetic qualities. Other elements may also be employed, such as sodium or phosphorous, whose altered properties could provide early warning signs of strokes or heart attacks. It may be possible to tag cloned antibodies with a detectable element as a tool to study such disorders as diabetes, allergies, infertility, and cancer.

An NMR imaging system may be described generally in connection with FIG. 12. FIG. 12 is an exploded perspective drawing illustrating a static field magnetic coil 20, and X, Y, and Z gradient coils 61, 62 and 63, respectively. In an NMR measurement system, the gradient coils 61, 62 and 63 are placed within the static field magnetic coil 20, and a patient 64 is placed in the cylindrical area inside of the coils.

To make an image, a control computer 31, (see FIG. 13), establishes a grid of tiny boxes, or voxels, in three dimensions, X, Y and Z. First the magnetic field is varied in the Z direction, from head to toe, to define a plane of interest where the body 64 will be scanned. Within this plane protons wobble at a given frequency, F. Radio frequency ("RF") coils 22 then emit a pulse at precisely the same frequency to topple these protons.

Before the protons can realign themselves, other coils 62 briefly vary the magnetic strength of the plane in the Y direction. This causes protons to wobble at different rates from the top of the plane to the bottom. Detecting these differences over many pulse-and-response cycles, the computer 31 locates voxels in the Y direction.

Coils 61 then vary the magnetic field from left to right in the X direction, causing protons to "sing" at different frequencies as they realign themselves. A similar process is performed using the Z gradient coils 63. Having located each voxel in the X, Y and Z directions, the computer 31 assigns each voxel a spot on a video screen. The spot's brightness is determined by the number of protons within the voxel and the magnetic properties of the tissue. Together the dots form a readable image.

An RF pulse is generated by an RF transmitter 27a, and then fed to the RF coil 22 through an RF switch 24. After the pulse has been transmitted, the RF switch 24 switches the RF coil 22 to the RF receiver 27b. The RF coil 22 then acts as a receiving antenna to pick up the signals emitted by protons when the protons "sing" as they realign themselves.

Further description of magnetic resonance imaging appears on pages 14–23 of the January 1987 issue of *National Geographic*, the entirety of which is incorporated herein by reference. Further background information appears in U.S. Pat. No. 4,599,565, issued to Hoenninger, III, et al., entitled "Method and Apparatus for Rapid NMR Imaging Using Multi-Dimensional Reconstruction Techniques", the entire disclosure of which is incorporated by reference. Also, the entire disclosure of U.S. Pat. Nos. 4,634,979, 4,583,044 and 4,585,992 are all incorporated herein by reference.

In a more technical description of nuclear magnetic resonance, NMR may be described as a technique by which anatomical images and biochemical information can be obtained noninvasively from a patient's body. Unlike conventional x-ray CT-scan technology, no harmful ionizing radiation is used. Instead, harmless static magnetic fields and short pulses of radio frequency energy is used to induce desired species of atomic nuclei in the body to a state of resonance. This nuclear resonance generates a resonant magnetic field which is received from body tissues during the time intervals between RF pulses. This received signal termed free induction decay ("FID") is then detected, sampled, and digitally processed into the desired presentation format, whether it be anatomical images, or chemical spectra.

Other than being more safe, NMR imaging and NMR chemical spectroscopy are superior to x-ray CT technology in several important ways. NMR spectroscopy can provide in-vivo metabolic information, which x-rays cannot do. NMR imaging, more commonly referred to as magnetic resonance imaging ("MRI") is capable of much more resolving power than can be had with x-ray images. X-ray imaging relies upon the relative electron densities of different tissues to contrast them. MRI generally relies on the hydrogen nucleus or relative proton densities to contrast between tissues. Although other atomic nuclei such as fluorine or phosphorous may be used for imaging as they are in spectroscopy, hydrogen protons are most often used because of their abundance in the body, hence strong FID signal. In addition to the relative abundance of protons in tissues, $T_1$ and $T_2$ relaxation times may be used to further contrast different tissues. $T_1$ is a property of the molecular structure of a tissue, and $T_2$ is a property of the number of differences in molecular structures of a tissue. $T_1$ is the time required for resonant protons to relax back to an nonresonant state during the receive period following the excitatory RF pulse. Generally, the more rigid tissues like bone and muscle have shorter $T_1$'s than the more fluid tissues like blood and lymph. $T_2$ relaxation is due to a relative dephasing of the poles of precessing protons over time, thereby causing a decay in the signal level received. So with NMR's chemical information available plus three degrees of freedom in image contrasting versus one degree of freedom for x-ray, tissues may be resolved and contrasted with NMR where x-ray techniques fail. Small tumors, or tumors with similar densities to their host tissue cannot be detected with x-rays, but can be detected with NMR. Regions of tissue death or disfunction as in a stroke in the brain, or an infarct in the heart can often only be detected with NMR. Soft tissues in general can be resolved using NMR to a much higher degree than can be done with x-rays.

The part of the NMR system that is used to transmit the RF pulse, and to receive the FID signal from the patient, is an RF tuned antenna commonly referred to as a coil. The coil is a resistive-inductive-capacitive ("RLC") circuit tuned to the static magnetic field dependent resonant frequency of the desired atomic nuclei. The traditional coil structure is usually an inductive loop of wire whose terminals are in electrical parallel with a variable capacitor. Capacitance is varied to tune the coil to the desired nuclear resonant frequency for maximum energy transfer, much like tuning a radio or television to a desired frequency for maximum signal reception. For a given static magnetic field, each nuclei has its own characteristic resonant frequency by the relation:

$$\omega = \gamma B_0$$

where $\omega$ is the resonant frequency, $\gamma$ is a nuclei specific constant, and $B_0$ is the field strength of the static field. A coil is placed near the surface of a patient such that the axis of the coil is perpendicular to the axis of the magnet within which the coil and patient are positioned. For the direction of the RF pulse coupled to the terminals of the coil, a $B_1$ resonant magnetic field is stored in space about the inductive loop of the coil. The homogeneous portion of this $B_1$ field in the center of the coil is perpendicular to the static $B_0$ field of the magnet. The nuclei specified by the resonant frequency of the coil align as would tiny bar magnets with the resonant $B_1$ field of the coil. After the RF pulse is terminated, the nuclei relax or realign with the $B_0$ field of the magnet. The spinning or precessing net alignment of the poles of the nuclei population is termed the magnetization vector. This magnetization vector is induced by the RF pulse to the coil during transmission, and then in turn induces an RF current in the coil during the FID signal reception period between pulses as the vector realigns with the $B_0$ field.

This FID signal is very low, (typically measured in microvolts), especially for nuclei less abundant and less sensitive to NMR than protons. The signal-to-noise ratio ("SNR") is therefore critical. An increase in the SNR translates directly into more NMR data. More body chemistry may be seen. Higher resolution, higher contrast images may be obtained. Of all NMR system components, the coil placement and design has the most impact on the SNR. A coil is electrically loaded when the coil is placed near the patient surface. Loaded coils have been shown theoretically and empirically to adhere to the following proportionality:

$$SNR \propto \eta M \sqrt{Q \omega V}$$

where $\eta$ is the degree to which the coil is loaded, M is the magnitude of the magnetization vector, Q is defined as the energy stored in the field about the coil divided by the power dissipated in the patient and in the coil, and $\omega$ is the resonant frequency of the nuclei and the tuned coil. As we saw earlier, ω is directly proportional to $B_0$, the magnetic field strength. V is the volume of the coil.

To improve the SNR of a coil, we wish to increase Q, ω, and V by coil design. η is dependent on the coil proximity to the patient. M is dependent on the magnetically coupled nuclei. In the past, for traditional single loop, or series loop coils, one could not increase Q, ω, and V simultaneously, but had to sacrifice one variable for an improvement in another. To increase V, we increase the inductance of the coil, thereby decreasing Q and ω. If the field strength of the magnet used in the NMR system is increased, ω increases. But to increase ω for a conventional coil, V is lost. Most conventional series type coil designs used in the past were not capable of achieving the higher resonant frequencies required by higher $B_0$ field magnets. Finally, to increase Q, the size of the coil V had to be decreased.

With the present invention, all three parameters Q, ω, and V can be simultaneously increased to improve the SNR of a surface applied coil. This invention involves a substantially planar array of two or more electrically resonant ("RLC") loops connected in electrical parallel with respect to each other and their transmit/receive source. These loops are connected such that all are excited with equal phase and equal RF energy. These loops can be individually switched, or attenuated to produce a desired $B_1$ magnetic field distribution. This net field distribution is the superposition of the fields from each loop.

Connecting N loops together in a parallel array permits five advances in surface coil technology: (1) an increase in V by a factor of up to N; (2) an increase in ω by a factor of up to N; (3) an increase in Q by a factor of up to N; (4) an overall increase in SNR; and, (5) an improvement in magnetic field spatial localization capabilities.

The strong magnetic fields and large volumes used in state-of-the-art NMR in-vivo applications require the advances in coil technology listed above.

In nearly every NMR application, the sample coil is made to resonate at the frequency used. Normally, the sample coil is tuned to resonance using an external capacitor. For a given coil, there is a frequency above which it is difficult to attain resonance because the capacitance cannot be made small enough. The resonant frequency is inversely related to the square root of the inductance multiplied times the capacitance. Thus, if one attempts to use a larger coil in order to obtain a higher field strength to improve signal-to-noise ratio, the highest frequency at which that coil may be effectively used will be severely limited. These limitations encountered in old coil designs constitute a significant problem which is addressed by the present invention.

Attempts have been made in the past to overcome deficiencies in surface coils used in nuclear magnetic resonance measurements. One such attempt involved the use of surface coils referred to as loop-gap resonators. An example of such an attempt is described in an article published in *Medical Physics* by James S. Hyde, et al., entitled "Planar-Pair Local Coils For High-Resolution Magnetic Resonance Imaging, Particularly Of The Temporomandibular Joint." A two-loop, one-gap resonator is shown. The loops formed inductance, and the gap provided capacitance.

Currents in the loop, however, were forced by the potential across the gap to be in opposite directions. Thus, the magnetic fields produced within each loop were out of phase. This caused a shadow to be formed in the image between the two loops because the magnetic fields generated by the two loops destructively interfered with each other. These so-called loop-gap resonators were stated by the authors to be useful for imaging nominally symmetrical structures on either side of the body mid line in those cases where the intervening tissue is not of interest. While the authors claim such loop-gap resonators may be useful to image orbits, breasts and/or kidneys, the limited applicability of such a device is a severe disadvantage. It is desirable to have an improved surface coil configuration which may be used to image an increased area of patient tissue, including all intervening tissue. In most applications, the intervening tissue normally is of interest.

In the Hyde et al. article, the authors state that with two loops the inductance doubles and the apparent resistance (due to eddy currents) doubles, resulting in an unchanged Q. The authors also state that because the effective resistance is doubled, the signal-to-noise ratio is reduced. Thus, the so-called loop-gap resonators were not even claimed to be effective in improving the signal-to-noise ratio.

In an article published in the *Journal of Magnetic Resonance* by Stephen B. W. Roeder, et al., entitled "NMR Coils With Segments In Parallel To Achieve Higher Frequencies Or Larger Sample Volumes", the authors describe an apparent attempt to connect coils in parallel. However, the coils were arranged axially. In this article, the authors state that dividing a coil into a number of parallel loops or subcoils should result in a coil with a Q reduced, at most, by the number of subcoils.

Contrary to the teachings of the Roeder et al. article, the present invention allows the Q of planar surface coils, electrically connected in parallel, to result in a Q which may be increased by a maximum amount which may approach as a limit the number of subcoils which are connected in parallel. The inductance may be reduced, thereby simultaneously allowing an increase in the resonant frequency. The area of the imaging field which is provided by the parallel planar surface coils is also increased.

In the prior art, there has been no disclosure of how to increase the resonant frequency, increase the Q, and increase the volume V covered by a surface coil, all at the same time. One feature of the present invention is that it allows all three of these factors to be increased simultaneously.

BRIEF DESCRIPTION OF THE DRAWINGS

FIG. 1 is a block diagram schematically illustrating an NMR imaging system.

FIG. 2 is a schematic diagram of a series resonant circuit model for an NMR probe.

FIG. 3 is a schematic diagram illustrating a parallel lumped element circuit model for an NMR probe.

FIG. 4 illustrates a surface coil having two loops electrically connected in parallel in accordance with the present invention.

FIG. 8 depicts the magnetic field map measured for a two loop parallel array constructed in accordance with the present invention.

FIG. 9A is an NMR image of vertebrae taken using a single loop surface coil.

FIG. 9B is an NMR image of vertebrae taken using a two loop parallel array constructed in accordance with the present invention.

FIG. 11 is a perspective view depicting the resultant magnetic fields for the coil array shown in FIG. 4.

FIG. 12 is an exploded view of an NMR imaging system scanner.

DETAILED DESCRIPTION OF A PREFERRED EMBODIMENT

Figure 6:
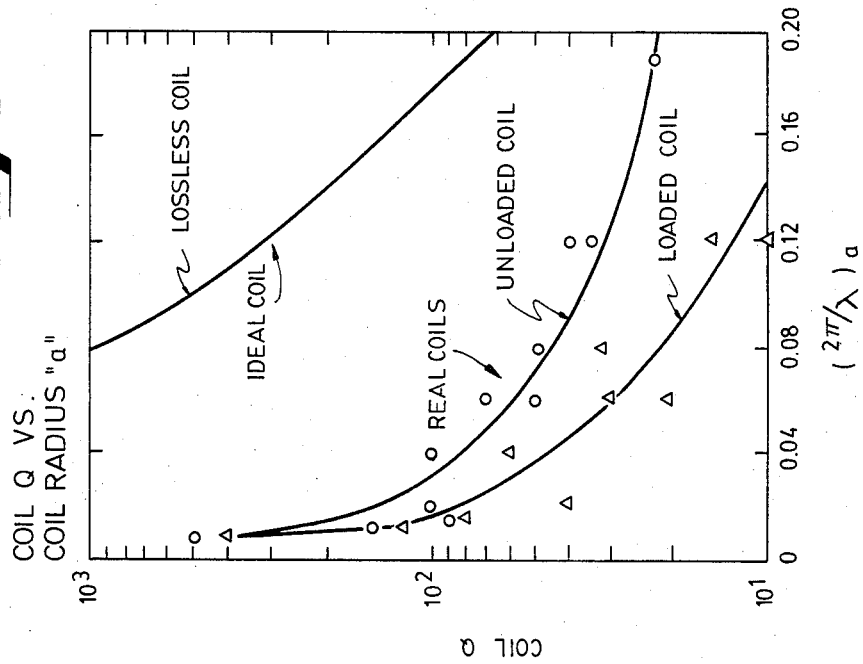
FIG. 6 is a graph showing the Q of a coil as a function of the size of the coil in relation to the frequency.

FIG. 1 shows a general block diagram for a nuclear magnetic resonance ("NMR") imaging system. The system includes means 20 for generating an applied main magnetic field, indicated generally by the dashed vertical lines in FIG. 1. The means 20 for generating the main magnetic field 21 may be a permanent magnet or an electromagnet 20. The patient (not shown) to be tested is, of course, positioned within the applied magnetic field. A sample coil 22 is then placed immediately adjacent the area of the patient to be imaged. A radio frequency pulse is then applied to the sample coil 22 in order to induce magnetization, which is shown in FIG. 1 by the dashed horizontal lines 23. The magnetization vector 23 induced in the sample coil 22 has at least a component of the magnetic field in a direction orthogonal to the direction of the applied main magnetic field 21.

The sample coil 22 acts as a transmitting loop 22 during the part of the NMR imaging process when the RF pulse is applied to the sample coil 22.

After the RF pulse has been transmitted, the sample coil 22 may then be used as a receiving loop or antenna 22. A small current is induced in the sample coil 22 which may be detected. This small sample signal may be amplified and processed into an image of the patient's tissue.

An NMR imaging system may also include a transmit/receive ("T/R") switch 24. The T/R switch 24 may be coupled to a radio frequency power amplifier 25, and also to a preamplifier and prefilter circuit 26. Both the RF power amplifier 25 and the preamplifier circuit 26 may be connected to a transceiver 27. A frequency synthesizer 28 is connected to the transceiver to control the frequency of the RF energy supplied to the sample coil 22. A pulse programmer 29 may be used for modulating the RF pulses.

The received signal is processed and detected by the transceiver 27. A quadrature audio detection scheme is preferably utilized. The received signal is fed to an analog-to-digital ("A/D") converter circuit 30 to produce a digital output. The digital output from the A/D circuit 30 is preferably fed to a front end computer or CPU 31. The front end CPU 31 may be used to take the data which is digitized by the A/D circuit 30, and to process it using fast fourier transforms. The processed data may then be stored by the front end CPU 31. The front end CPU 31 also generates a control signal, indicated by the dotted line in FIG. 1, which is fed to the pulse programmer circuit 29. The front end CPU 31 is also in electrical communication with a back end computer or CPU 32. The back end CPU 32 may be used for signal processing, and for coupling to a user interface and other peripherals. In the illustrated embodiment, the back end CPU 32 is connected to a display 33, which may be used to produce the resultant image obtained by the system.

In operation, the pulse programmer 29 may be used to modulate radio frequency energy in the transceiver 27 having a frequency determined by the frequency synthesizer 28. This pulse modulated RF signal is fed to the power amplifier circuit 25 which is coupled to the sample coil 22 by the T/R switch 24. After the pulse has been transmitted, the T/R switch 24 then switches to the receive position, thereby coupling the preamplifier circuit 26 to the sample coil 22. Signals picked up from the sample by the coil 22 are routed through the T/R switch 24 to the preamplifier circuit 26, where the sample signals are amplified and prefiltered. The received signal is then fed to the transceiver 27, where a suitable detection circuit is utilized to demodulate the received radio frequency signal. The A/D circuit 30 then converts the received signal into a digital output which is fed into the front end computer 31. The front end CPU 31 preferably utilizes a fast fourier transform analysis, and generates a control signal which is fed back to the pulse programmer 29. The received data is further processed by the back end CPU 32. The data may then be displayed on a suitable display 33, stored, or fed to other peripherals.

The present invention is particularly concerned with the design and construction of the sample coil 22. The sample coil 22 may also be referred to as an NMR probe 22. In the past, attempts have been made to model an NMR probe or sample coil 22 using a series resonant circuit model, as shown in FIG. 2. This circuit model uses an inductor 34, resistor 35 and capacitor 36 connected in series with a source of a RF magnetic resonance signal 37. The resistance "R" of the resistor 35 is the effective resistance of the coil 22. For a series circuit of the type modeled in FIG. 2, the Q of the circuit may be expressed as:

$$Q \approx L/CR$$

where Q is the quality factor of the circuit illustrated in FIG. 2, L is the inductance of the inductor 34, C is the capacitance of the capacitor 36, and R is the effective resistance of the coil. This circuit model is believed to be incorrect, and leads to the misconception that higher Q may be obtained by increasing the inductance of the sample coil 22. As shown by the above equation, if this were a valid circuit model, increasing the value of the inductance "L" of the inductor 34 would cause the Q to increase. This is not the case in practice.

A better model for the NMR probe 22 is shown in FIG. 3. The source of RF 37 has a resistance or characteristic impedance 38. The coil 22 has a capacitance 36, a resistance 35, and an inductance 34 associated with it. Where the coil 22 consists of two or more subcoils, the values for the resistance 35, inductance 34, and capacitance 36 are considered to be the equivalent resistance, the equivalent inductance, and the equivalent capacitance of the coils. The Q of the NMR probe 22 shown in FIG. 3 may be expressed as follows:

$$Q \approx C/LR$$

In this case, R is the effective resistance, and is determined by the resistance $R_c$ of the coil and the resistance $R_p$ of the patient.

The circuit model shown in FIG. 3 is a better circuit model for a surface coil 22 used as the NMR probe 22. The implications of this circuit model are that the Q of the coil is proportional to the equivalent capacitance 36. In a preferred embodiment, a good capacitor is essential for effective operation. A good capacitor is needed to handle voltage spikes. If the capacitor arcs, bad results will be experienced in the NMR image. The Q of the capacitor can be a severely limiting factor in the design of the sample coil 22.

In the circuit model shown in FIG. 3, the Q of the sample coil 22 is inversely proportional to the value in the inductance. Thus, by decreasing the inductance, the Q of the coil may be increased.

With these considerations in mind, an embodiment of a surface coil 22 constructed in accordance with the present invention may now be discussed with reference to FIG. 4. The sample coil 22 constructed in accordance with the present invention preferably includes two electrically parallel equal phase resonant loops in a planar configuration with respect to each other.

As shown in FIG. 4, the sample coil or surface coil 22 preferably includes a first subcoil or loop 40 and a second subcoil or loop 41. In a preferred embodiment, a capacitor 42 is also connected in parallel with the first loop 40 and the second loop 41. The first loop 40, second loop 41 and capacitor 42 are also connected to the T/R switch 24, (see FIG. 1).

The first loop 40 couples with a first volume 43 within the region bounded by the first loop 40. Within this first volume 43, a portion of the sample magnetization vector 23 is induced. An FID signal from the patient's tissue bounded by the sensitive volume 43 may be obtained for images or chemical spectra.

Similarly, the second loop 41 also defines a second volume 44. The patient's tissue bounded by the second volume 44 may also be imaged. The outer perimeter 54 of this two loop array defines a third volume 55. The magnetically coupled volume 56 of the whole array results by summing the in phase $B_1$ fields of the three volumes 43, 44 and 55.

It will be appreciated by those skilled in the art that the imaging area permitted by the sample coil 22 constructed in accordance with the embodiment of the invention illustrated in FIG. 4 has been effectively increased to include the first volume 43 and the second volume 44, and the combined volume 55. Thus, the present invention permits a relatively large sample volume 43, 44 and 55 for imaging and spectroscopy, as compared to a single sample loop.

As discussed above, the Q of the sample coil 22 is inversely related to the effective inductance of the sample coil 22. In the embodiment of the invention illustrated in FIG. 4, the reciprocal of the effective inductance is equal to the sum of the reciprocals of the inductance of the individual loops 40 and 41. In this two loop example, the effective inductance is equal to the product of the individual inductance of each loop 40 and 41, divided by the sum of the inductance of the individual loops 40 and 41. If the inductance of the first loop 40 is equal to the inductance of the second loop 41, the effective inductance of the total surface coil 22 will effectively be half the inductance of either one of the loops 40 or 41. In other words, if the inductance of each single loop 40 and 41 was 10 millihenrys, the total effective inductance of the two loop array 22 would be 5 millihenrys.

In conclusion, it will be seen that the present invention increases the Q of the surface coil 22 by reducing the effective inductance.

It is desirable to have the phase relationship of the magnetic fields created by the first loop 40 and the second loop 41 to be such that destructive interference between the magnetic fields is not created. In the present invention, the first loop 40 and the second loop 41 are connected in phase with each other. For example, at any point in time when the instantaneous voltage at node 45 is greater than the instantaneous voltage at node 46, current will flow through the first loop 40 and the second loop 41 in the direction indicated by the arrows. Thus, the direction of the magnetic fields generated by the current flowing through the first loop 40 and the second loop 41 will be in the same direction. The present invention does not create destructive interference, and consequent loss of the image, in the region 47 between the first loop 40 and the second loop 41. The $B_1$ fields of regions 40 and 41, and the array perimeter 54 defined region 55, add in phase (constructively) to "fill in" region 47. A more complete image of the intervening patient's tissue is therefore possible.

In a preferred embodiment, the capacitor 42 is included in parallel with the first and second loops 40 and 41. The value of the capacitor 42 is selected so that the loops 40 and 41 resonate at the RF frequency of the magnetic resonance signal used to generate the sample magnetic field 23.

In the present invention, the first loop 40 and the second loop 41 are surface coils, and are configured in a planar configuration with respect to each other. In other words, the first loop 40 and the second loop 41 lie flat in the same plane. Preferably, the axis of the first loop 40 does not intersect the axis of the second loop 41. It will be seen from FIG. 4 that the first loop 40 and the second loop 41 are electrically connected in parallel with each other.

In accordance with the present invention, a plurality of subcoils or loops 40, 41 may be connected in parallel, and in phase, to simultaneously increase the area which may be effectively imaged, increase the Q of the sample coil 22, and also increase the resonant frequency of the sample coil 22. In other words, the sample coil 22 composed of parallel loops 40 and 41 may now be tuned to a higher frequency. All of the above effects result in an improvement in the signal-to-noise ratio. Of course, improved signal-to-noise ratios yield the benefits of providing high resolution, high contrast images, more nuclei may then be seen, more sensitive measurements may be achieved and other nuclear species less responsive to magnetic resonance may then become visible.

For a circular loop having a radius "r", the depth of field penetration will be equal to about the radius "r" of the loop. Actually, this field is in the form of a sphere. Normally in NMR measurements only half of the sphere is used, because the patient or other sample to be measured is located on only one side of the sample coil.

The present invention improves the depth of field penetration. This may be understood by considering FIG. 11. FIG. 11 is a perspective view of an array 22 of two RF current loops 40 and 41 constructed in accordance with FIG. 4. The capacitor 42 has been omitted from FIG. 11 for purposes of simplification because it is unnecessary for the present discussion. It will be understood, however, that a capacitor 42 is preferably included.

The first loop 40 couples with a first volume 43. Only the magnetic field induced within the hemispherical volume 43 is considered for purposes of present discussion. The field on the other side of loop 40 is disregarded. As stated above, the depth of field penetration for loop 40 is equal to about the effective radius of the loop 40. Second loop 41 similarly couples with a second volume 44, as shown in FIG. 11. Loop 40 and loop 41 are connected in phase with each other, and are electrically connected in parallel.

The outer perimeter 54 of the two loop array 40 and 41 illustrated in FIG. 11 effectively defines a larger current loop. This effective parameter loop 54 couples with a third volume 55. Of significant interest here is the fact that the depth of field penetration for the effective parameter loop 54 is equal to about the radius of the effective loop 54. Thus, the depth of field penetration for the third volume 55 will be greater.

The magnetization vectors associated with the magnetic field in the first volume 43, the second volume 44 and the third volume 55 may be added vectorially to result in a net effective volume, shown generally in FIG. 11 by the reference numeral 56. For purposes of illustration, the volumes 43, 44, 55 and 56 have not necessarily been drawn to scale in FIG. 11. The magnetically coupled volume 56 of the whole array 22 results by summing the in phase $B_1$ fields of the three volumes 43, 44 and 55. It will be seen from the above discussion that the present invention provides an advantageous depth of field penetration for a sample coil array 22. In order to achieve this advantage, the first loop 40 and the second loop 41 should be adjacent to each other. In other words, the first loop 40 and the second loop 41 are preferably placed in side-by-side relationship, and positioned as closely as possible to each other. The first loop 40 and the second loop 41 should be magnetically coupled sufficiently close to each other so that the two individual loops 40 and 41 effectively form a larger perimeter loop 54 having a third volume 55. This results in the desirable advantage of producing an effective total volume 56 which provides an advantageous depth of field penetration for the sample coil array 22. As discussed above, the inner wires 57 and 58 forming the adjacent portion of the loops 40 and 41, where current flows in opposite directions in the adjacent wires 57 and 58, may be shielded to avoid immediate near field dropout.

Referring to FIG. 4, the two loops 40 and 41 have inner wires 57 and 58 which cross each other. Although shown roughly in the shape of an "X" in FIG. 4, the inner wires 57 and 58 may be roughly parallel to each other. At any given instant, the currents flowing in the inner wires 57 and 58 will be in opposite directions. Thus, there may be some near field dropout as a result. Such dropout in the magnetic field may occur over a region about half the distance between the two wires 57 and 58, (i.e., the radius of the space between the wires). The inner wires 57 and 58 may be shielded with shielding 59 and 60 to avoid immediate near field dropout.

Figure 5:
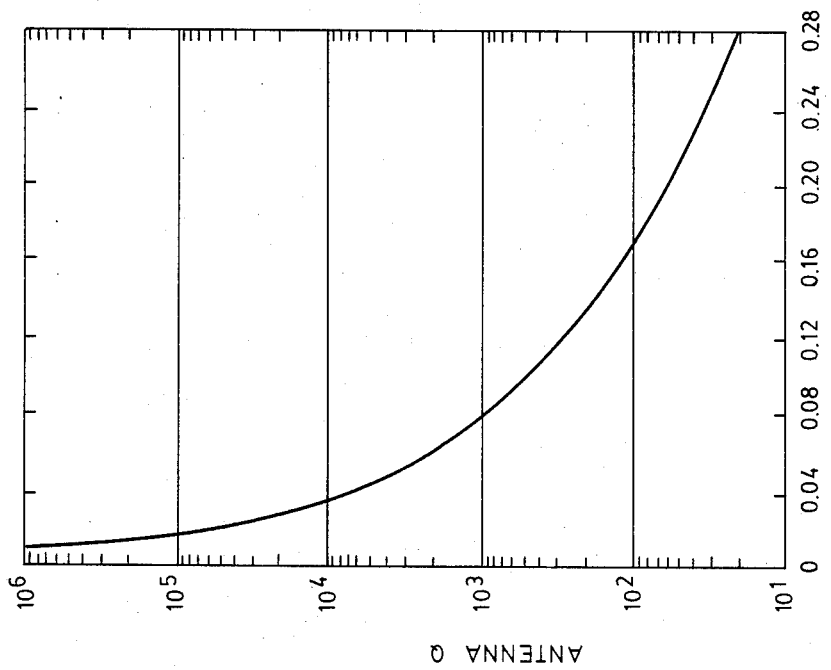
FIG. 5 is a graph showing the Q of an ideal antenna as a function of the size of the antenna.

FIG. 5 is a graph illustrating the Q of an ideal (lossless) antenna as a function of $\beta a$, where a is the radius of a sphere enclosing the antenna. $\beta = 2\pi/\tau$. This graph illustrates the principle that the Q of an antenna ordinarily becomes smaller as the antenna is made larger.

FIG. 5 illustrates the Q of a coil as a function of $$\frac{2\pi}{\lambda} \times a,$$

where a is the radius of a sphere enclosing the coil, and $\lambda$ is the frequency. The plot for an ideal (lossless) coil is compared to actual coils, both loaded and unloaded. The Q of a coil will normally decrease when the coil is loaded. In NMR imaging, a coil is loaded when it is placed in close proximity to the patient's tissue. Referring to the equivalent circuit shown in FIG. 3, the resistance 39 of the patient tends to load the coil and reduce the Q of the circuit.

Figure 7:
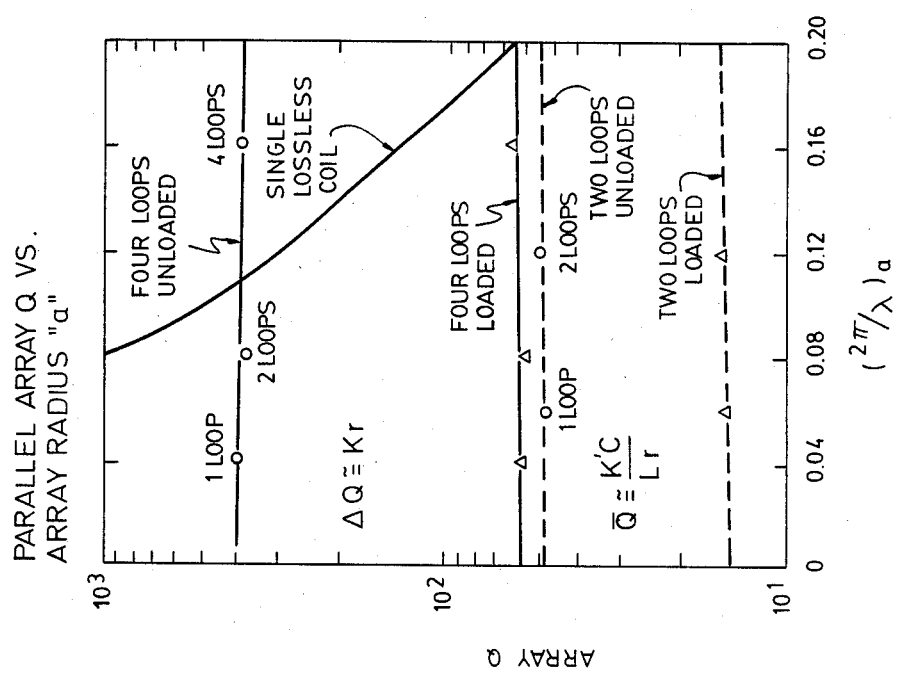
FIG. 7 is a graph similar to FIG. 6 illustrating the effect of parallel array loops upon the effective Q of the loops.
Figure 13:
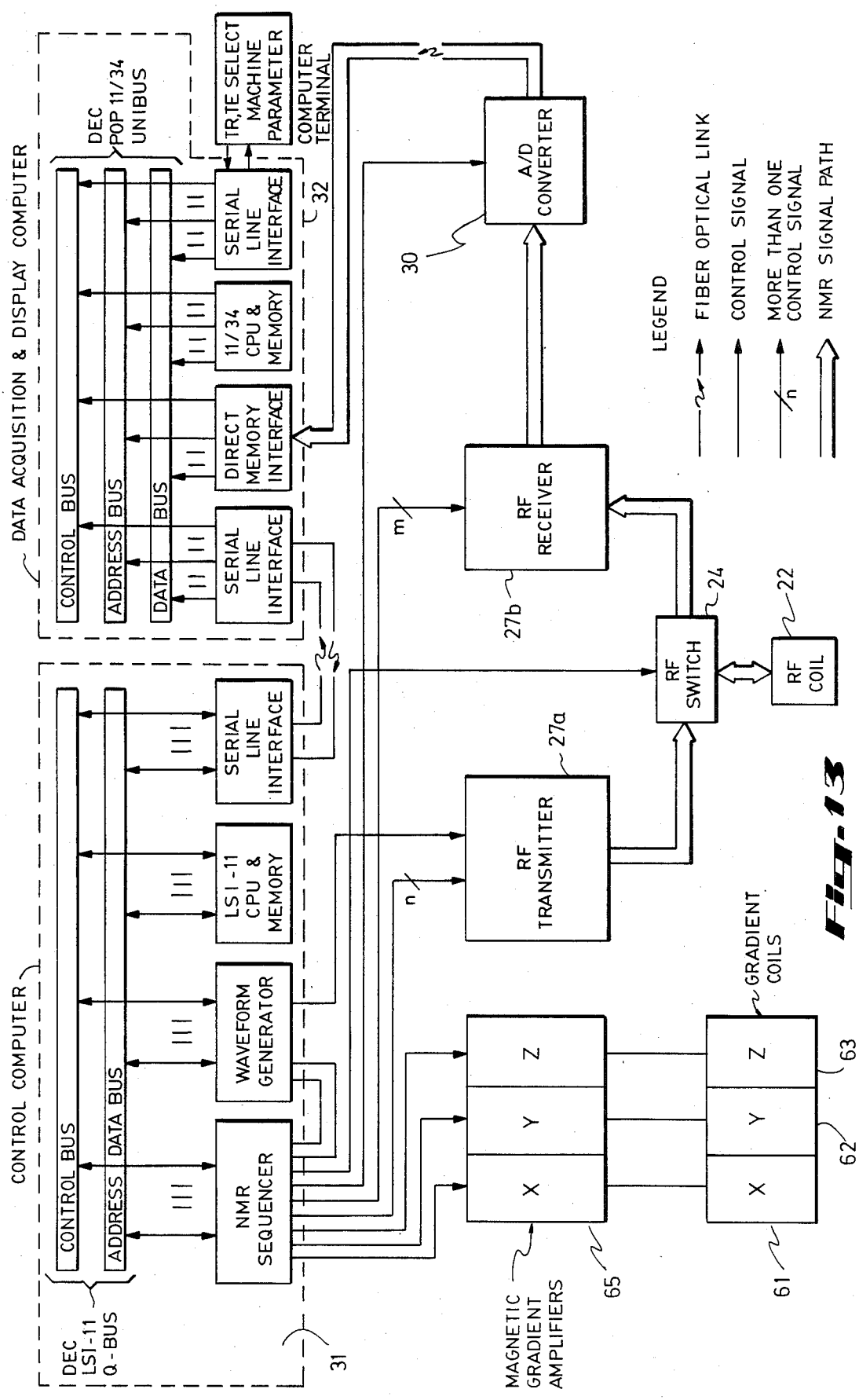
FIG. 13 is a schematic block diagram of an NMR imaging system.

FIG. 7 plots the Q for a parallel array of subcoils or loops, as a function of $$\frac{2\pi}{\lambda} \times a,$$

where a is the radius of a sphere enclosing the coil array, and $\lambda$ is the frequency of interest. The graph of FIG. 7 is significant in that it illustrates how loops can be connected in a parallel array without reducing the Q of the coils. It will be appreciated that two or four loops connected in parallel provide a significant increase in imaging volume, as compared to a single loop. Thus, the imaging volume and/or the frequency may be increased without simultaneously reducing the Q of the coils.

FIG. 8 illustrates a magnetic field map for a surface coil 22 constructed in accordance with the present invention. Specifically, a coil 22 consisting of two loops 40 and 41, as shown in FIG. 4, was energized and the magnetic field map imaged. Significantly, there is no cancellation of the magnetic field in the region 47 between the first loop 40 and the second loop 41. This is a significant advance in NMR imaging over out-of-phase loops of the type sometimes referred to as loop-gap resonators.

FIG. 9A is an example of an NMR image of a spine taken with a single loop surface coil. FIG. 9B is an example of an NMR image of a spine taken with a surface coil constructed in accordance with the present invention, as shown in FIG. 4. An example of greater areas which may be imaged using a surface coil in accordance with the present invention is shown by a comparison of FIG. 9B versus FIG. 9A. Much more of the spine is visible in FIG. 9B when using a surface coil constructed in accordance with the present invention.

Figure 10:
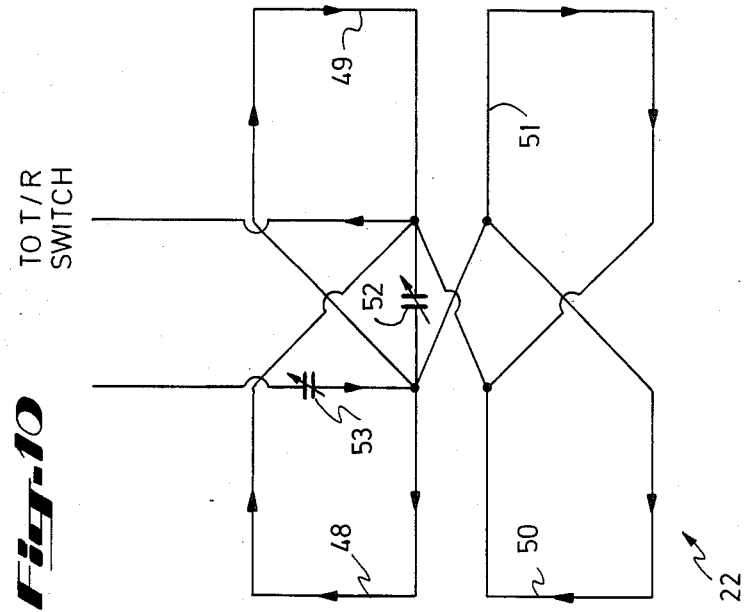
FIG. 10 is a schematic diagram of a four loop parallel array constructed in accordance with the present invention.

FIG. 10 illustrates an example of a surface coil 22 which includes a parallel array of four loops. The surface coil 22 has a first loop 48, a second loop 49, a third loop 50, and a fourth loop 51. As shown in FIG. 10, the first, second, third and fourth loops 48, 49, 50 and 51 are connected in phase. For example, at a given instant in time when the current flowing through the first loop is in a clockwise direction as shown in FIG. 10, the current flowing through the second loop 49, the third loop 50 and the fourth loop 51 will also flow in a clockwise direction. Thus, the $B_1$ magnetic fields produced by the loops 48, 49, 50 and 51 will all be in the same direction, and will not destructively interfere, but will constructively add.

All of the loops 48, 49, 50 and 51 illustrated in FIG. 10 are preferably coplanar, that is, all substantially lying within the same general plane. This construction is to be distinguished from axial coils, which do not provide increased image areas for a given loop size.

In a preferred embodiment, a variable tuning capacitor 52 is provided in order to resonate the four loop array at the desired frequency of operation. The tuning capacitor 52 is electrically connected in parallel with the loops 48, 49, 50 and 51.

It may also be desirable to provide a matching circuit between the T/R switch 24 and the surface coil 22. In FIG. 10, a variable matching capacitor 53 is illustrated for this purpose. The matching capacitor 53 is shown connected in series with the T/R switch 24. Of course, a more complicated matching network could be substituted for the variable capacitor 53. For example, a pi network or L network could be substituted for purposes of matching the loop array 22 to the remainder of the NMR imaging system. Also, a matching capacitor 53 could be included between the surface coil 22 illustrated in FIG. 4 and the T/R switch 24.

The embodiment illustrated in FIG. 10 of a four loop array is one example of an equal phase resonant loop array electrically connected in parallel in a coplanar configuration. Other possibilities exist. Multiple, adjacent, coplanar loops can be arranged in a number of configurations as long as the perimeter current of the resulting array is in phase. As shown in FIG. 10, the instantaneous current at any moment flowing around the outside perimeter of the loops 48, 49, 50 and 51 is all in the same clockwise direction. This is what is meant by perimeter current. The loops should be connected electrically in a parallel arrangement.

Generally, multiple loop arrays may use loops which are of equal size, and which are symmetrically driven from a central point as shown in FIG. 10. However, under certain circumstances, it may be desirable to create a magnetic field shape which is not symmetrical. For example, a whole spine coil may be made of two adjacent parallel loops, one large loop for deeper lumbar penetration, and one short loop for more shallow thoracic penetration.

Further information is contained in J. T. Vaughan and R. L. Nunnally, "A New Model for In Vivo RF Coils", N.Y.A.S. Poster Session Abstracts (September 1986), the entire disclosure of which is incorporated herein by reference.

The above disclosure has been directed to a preferred embodiment of the present invention. The invention may be embodied in a number of alternative embodiments other than those illustrated and described above. A person skilled in the art will be able to conceive of a number of modifications to the above described embodiments after having the benefit of the above disclosure and having the benefit of the teachings herein. The full scope of the invention shall be determined by a proper interpretation of the claims, and shall not be unnecessarily limited to the specific embodiments described above.

What is claimed is:

1. A nuclear magnetic resonance measurement system, comprising in combination:
    means for generating an applied main magnetic field;
    an array of at least two radio frequency current loops, each loop being responsive to a radio frequency signal to generate a radio frequency magnetic field having a component in a direction orthogonal to the direction of the applied main magnetic field, the loops being electrically connected in parallel, the loops being oriented in a generally planar relationship with respect to each other, the loops being noncoaxial, the loops being connected in phase with respect to each other so that the component of the radio frequency magnetic field generated by the loops which is orthogonal to the direction of the applied main magnetic field is in the same general direction.

2. The nuclear magnetic resonance measurement system according to claim 1, further comprising:
    a capacitor electrically connected in parallel with the current loops.

3. A surface coil system for nuclear magnetic resonance measurement, comprising two planar electrically parallel equal phase resonant loops, the loops being in a planar configuration with respect to each other, the loops being noncoaxial.

4. The surface coil system according to claim 3, further comprising a capacitor connected in parallel with the two loops.

5. A nuclear magnetic resonance measurement system, comprising in combination:
    means for generating an applied main magnetic field;
    an array of two or more RLC resonant electrical current loops used as an antenna to selectively transmit and receive RF pulses, and NMR and FID signals, respectively, the loops of the array being adjacent to each other, coupled in parallel with a parallel capacitance, the loops being generally coplanar and noncoaxial, each individual loop having a perimeter, the loops effectively defining composite loops having a perimeter substantially equal to the outer perimeter of the individual loops defining each composite loop, the loops being commonly driven with equal phase in amplitude RF power to create a $B_1$ magnetic field whose volume about the array is the superposition of the $B_1$ field of the individual and composite loops of the array structure.

6. A planar surface coil array for nuclear magnetic resonance sensing, comprising:
    an array having at least two loops, the two loops being configured such that:
    (a) the loops are in phase so that the radio frequency magnetic fields generated by the loops generally add constructively;
    (b) the loops are electrically connected in parallel;
    (c) the loops are each generally planar surface coils;
    (d) the loops are generally configured in a coplanar relationship with each other;
    (e) the loops are not coaxial; and,
    (f) the loops are immediately adjacent each other in side-by-side relationship;
    the loops effectively forming a larger perimeter loop having constructive addition of the radio frequency magnetic fields generated by the loops.

7. The planar surface coil array according to claim 6, further comprising:
    a capacitor electrically connected in parallel with the loops.

8. The planar surface coil array according to claim 7, wherein:
    the loops have inner wires which are shielded to minimize near field dropout.

9. The planar surface coil array according to claim 6, wherein:
    a perimeter current flows through the portion of the loops defining the larger perimeter loop, the perimeter current flowing in the same circular direction through the larger perimeter loop.

10. The planar surface coil array according to claim 8, wherein:
a perimeter current flows through the portion of the loops defining the larger perimeter loop, the perimeter current flowing in the same circular direction through the larger perimeter loop.

11. A planar surface coil array for nuclear magnetic resonance sensing, comprising:
array having at least four loops, the four loops being configured such that:
(a) the loops are in phase so that the radio frequency magnetic fields generated by the loops generally add constructively;
(b) the loops are electrically connected in parallel;
(c) the loops are each generally planar surface coils;
(d) the loops are generally configured in a coplanar relationship with each other;
(e) the loops are not coaxial; and,
(f) the loops are immediately adjacent each other in side-by-side relationship;
the loops effectively forming a larger perimeter loop having constructive addition of the radio frequency magnetic fields generated by the loops.

12. The planar surface coil array according to claim 11, further comprising:
a capacitor electrically connected in parallel with the loops.

13. The planar surface coil array according to claim 12, wherein:
the loops have inner wires which are shielded to minimize near field dropout.

14. The planar surface coil array according to claim 11, wherein:
a perimeter current flows through the portion of the loops defining the larger perimeter loop, the perimeter current flowing in the same circular direction through the larger perimeter loop.

15. The planar surface coil array according to claim 13, wherein:
a perimeter current flows through the portion of the loops defining the larger perimeter loop, the perimeter current flowing in the same circular direction through the larger perimeter loop.

* * * * *

UNITED STATES PATENT AND TRADEMARK OFFICE
CERTIFICATE OF CORRECTION

PATENT NO. : 4,812,761

DATED : March 14, 1989

INVENTOR(S) : J. Thomas Vaughan, Jr.

It is certified that error appears in the above-identified patent and that said Letters Patent is hereby corrected as shown below:

Column 6, line 24, "Maqnetic" should be -- Magnetic --.

Column 15, line 9 (claim 11, line 3), insert "an" before "array".

Signed and Sealed this

Twenty-sixth Day of September, 1989

Attest:

DONALD J. QUIGG

Attesting Officer

Commissioner of Patents and Trademarks